United States Patent [19]
Lee

[11] Patent Number: 5,889,437
[45] Date of Patent: Mar. 30, 1999

[54] FREQUENCY SYNTHESIZER WITH LOW JITTER NOISE

[75] Inventor: Seog-Jun Lee, Seoul, Rep. of Korea

[73] Assignee: LG Semicon Co., Ltd., Choongcheongbuk-Do, Rep. of Korea

[21] Appl. No.: 891,977

[22] Filed: Jul. 11, 1997

[51] Int. Cl.[6] .............................. H03L 7/08; H03L 7/089; H03L 7/099; H03L 7/18
[52] U.S. Cl. ................................ 331/16; 331/1 A; 331/8; 331/17; 331/25; 331/27; 331/34; 331/57; 331/177 R; 331/186; 327/157; 327/159
[58] Field of Search ................................ 331/17, 25, 27, 331/34, 57, 177 R, 185, 186, 1 A, 8, 16; 327/105, 158, 157, 156, 159; 375/379

[56] References Cited

U.S. PATENT DOCUMENTS

| | | | |
|---|---|---|---|
| 4,068,189 | 1/1978 | Wilson | 331/186 X |
| 5,491,439 | 2/1996 | Kelkar et al. | 331/17 X |
| 5,515,012 | 5/1996 | Bhushan et al. | 331/57 X |
| 5,705,947 | 1/1998 | Jeong | 327/270 |

Primary Examiner—David Mis
Attorney, Agent, or Firm—Morgan, Lewis & Bockius LLP

[57] ABSTRACT

An improved apparatus for combining frequencies which is capable of generating a constant frequency when an external variation is applied thereto by implementing each block using a differential circuit, whereby it is adaptable to a mobile communication system, includes a phase frequency detector for comparing an input signal with a reference signal and for detecting a frequency or a phase error; a filter for differentially amplifying an output of the phase frequency detector for generating a lower frequency voltage corresponding to the error; a voltage control oscillator for generating a frequency corresponding to an output of the filter; a signal distribution unit for dividing the output of the voltage control oscillator into a predetermined times and for outputting a reference signal to the phase frequency detector; and a reference voltage generator for inputting reference voltages to the voltage control oscillator, respectively.

13 Claims, 5 Drawing Sheets

FREQUENCY SYNTHESIZER WITH LOW JITTER NOISE

BACKGROUND OF THE INVENTION

1. Field of the Invention

The present invention relates to a frequency synthesizer, and in particular to an improved coherent frequency synthesizer which can be implemented using a 0.8 μm CMOS integration technique, and which is adaptable to a mobile communication transceiver.

2. Description of the Conventional Art

Recently, wire less communication becomes more important in the information communication field. The number of subscribers to mobile communication systems adapting an analog technique has sharply increased due to its convenience; however, due to the limited capacity of the systems adapting the analog technique with a heavy communications load and the sharply increasing number of the subscribers, mobile communication systems adapting a digital technique were developed in an attempt to overcome the above-described limitation.

In a digital cellular communication system, many people can concurrently use the system within a limited frequency spectrum, and various kinds of digital information can be made available for subscribers, and it is possible to effectively achieve a desired security of the communication.

This type of mobile communication system includes a frequency synthesizer for generating a new frequency based on a reference frequency, with the reference frequency being stable accurate and having a pure spectrum.

The frequency synthesizer is generally implemented as a phase locked loop (PLL) since the cost of implementing the phase locked loop as a circuit for generating frequencies is low, and the spectrum purity is high.

The frequency synthesizer exhibits jitter noise which is classified into input jitter and output jitter and which has a close relationship to the loop bandwidth of the phase locked loop (PLL).

Namely, when the loop bandwidth is narrow, it is easy to remove the input jitter, however the jitter is increased due to the voltage controlled oscillator VCO since the tracking is lower. On the contrary, when the loop bandwidth is wide, the jitter is decreased due to the VCO, and it is difficult to remove the input jitter.

Therefore, in order to implement a frequency synthesizer having low jitter, the loop bandwidth of the phase locked loop (PLL) should be optimized.

In addition, in the output phase noise, at a lower frequency, the jitter noise is dependent upon a crystal oscillator, and at a higher frequency, the jitter noise is dependent upon the voltage controlled oscillator (VCO).

Here, since the jitter noise due to the crystal oscillator is smaller than the jitter noise due to the voltage controlled oscillator, the jitter noise characteristic of the frequency synthesizer is determined entirely by the jitter noise characteristic due to the voltage controlled oscillator (VCO).

Therefore, designing the voltage controlled oscillator (VCO) to have a low jitter noise is very important.

Namely, when implementing the phase locked loop (PLL), the design conditions of the voltage controlled oscillator and frequency divider are important factors in determining its speed and power consumption.

So far, the voltage controlled oscillator and the frequency divider having a higher frequency bandwidth have been implemented using a high speed chip integration technique such as ECL or GaAs. However, as the techniques related thereto have advanced, CMOS devices have been made compact-sized, and CMOS circuits having high speed characteristics are being made.

Namely, when using the oscillator in order to match a transmitter and a receiver of the frequency synthesizer, so far, an LC tank oscillator using a varactor has been used. However, the cost of the LC tank oscillator is high, and a high power consumption is incurred. In addition, the bulk and weight of the transceiver are increased. So as to overcome the above-described problems, a CMOS ring oscillator, which is capable of reduced power consumption, circuit integration, and having a high reliability has been introduced.

However, the above-described CMOS ring oscillator may degrade the performance of the frequency synthesizer since its is susceptible to power supply noise.

In addition, a CMOS voltage controlled oscillator (VCO), which is resistant to power supply noise and is directed to enhancing the temperature characteristic and is similar to an ECL type has been introduced. However, this CMOS voltage controlled oscillator (VCO) is not adaptable to mobile communications since he operating frequency is low.

In addition, a method of adapting a CMOS prescaler to the frequency divider has been introduced. However, this method is only directed to reducing the size of the device. In addition, a prescaler method using a dynamic circuit technique has been introduced. This method operates well at a high frequency; however, it is susceptible to the noise of the dynamic circuit.

SUMMARY OF THE INVENTION

Accordingly, it is an object of the present invention to provide a frequency synthesizer which overcomes the aforementioned problems encountered in the conventional art.

It is another object of the present invention to provide an improved frequency synthesizer which is capable of generating a sinal constant frequency even when an external variation is applied thereto, by implementing a differential circuit, whereby it is adaptable to a mobile communication system.

To achieve the above objects, there is provided a frequency synthesizer, which includes a phase detector for comparing an input signal with a reference signal and for detecting a frequency or a phase error therebetween; a filter for differentially amplifying an output signal of the phase frequency detector for generating a lower frequency voltage corresponding to the error; a voltage controlled oscillator for generating a frequency corresponding to an output of the filter; a signal distribution unit for dividing the output of the voltage controlled oscillator by a predetermined number of times and for outputting a reference voltage generator for inputting reference voltages to the voltage control oscillator, respectively.

The objects of the present invention can be achieved by using a 0.8 μm CMOS integration technique, with the oscillating frequency being in the range from 24.6 Mhz–492.8 Mhz.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
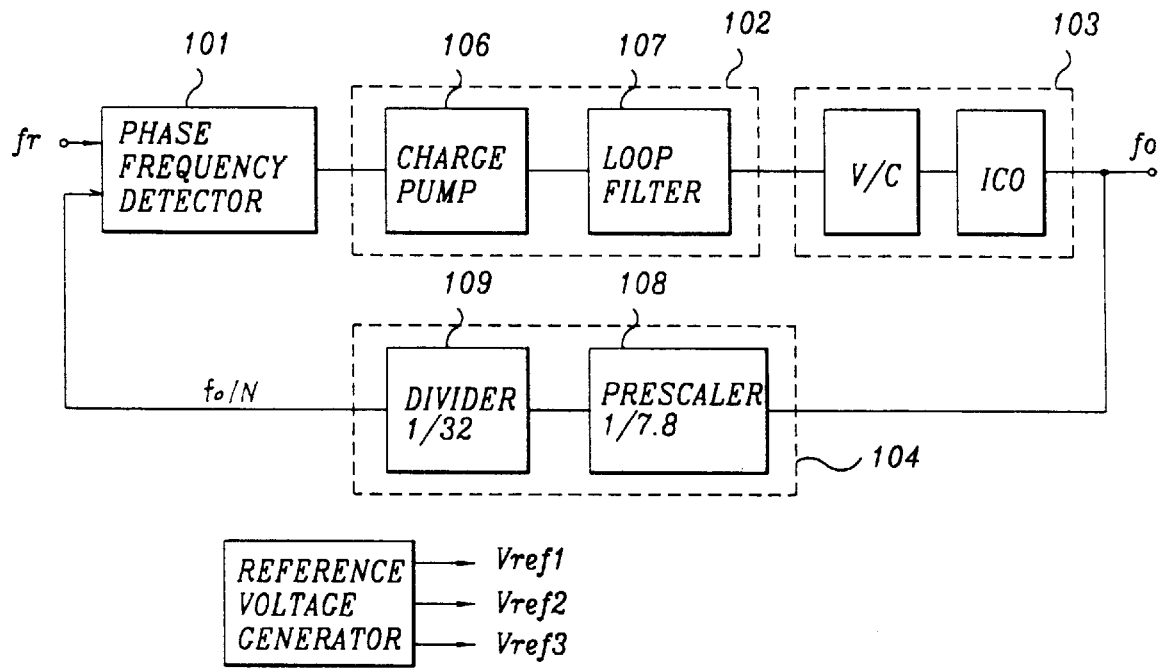
FIG. 1 is a block diagram illustrating a frequency synthesizer according to the present invention.

FIG. 1 is a schematic block diagram of a frequency synthesizer according to the present invention, which includes a phase or frequency detector 101 (hereinafter, "phase detector") for detecting a frequency or a phase error by comparing an input signal f0/N, with a reference signal of frequency fr, a filter 102 for filtering the error output by differentially amplifying the output signal of the phase detector 101, and for outputting a low frequency signal corresponding to the detected phase error, a voltage controller oscillator 103 for generating a signal of frequency f0 corresponding to the output voltage from the filter 102, a frequency divider 104 for frequency-dividing the output signal of frequency f0 from the voltage controller oscillator 103 by "N" and for outputting the signal of frequency f0/N to the phase detector 101, and a reference voltage generator 105 for applying reference voltage Vref1–Vref3 to the voltage control oscillator 103.

The input reference signal of frequency fr to the phase detector 101 is generated by using an oscillator such as a crystal oscillator which has low frequency variation and noise.

Figure 7:
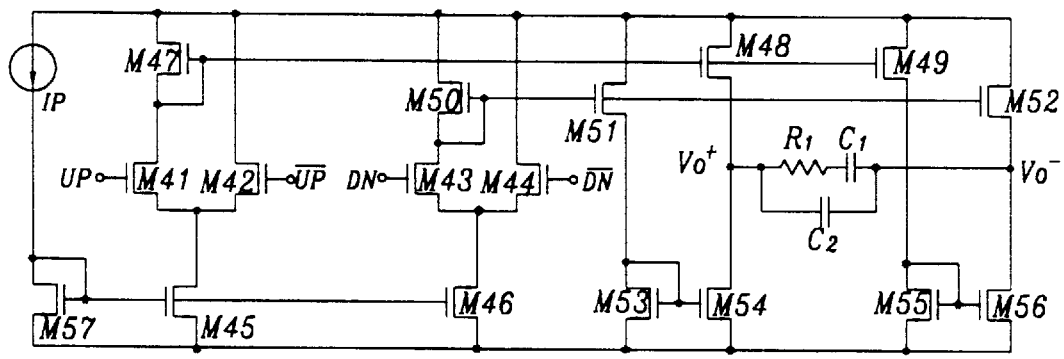
FIG. 7 is a circuit diagram illustrating a differential charge pump and a loop filter in the circuit of FIG. 1.

The charged pump and loop filter circuit 102, as shown in FIG. 7, includes a charge pump 106 and a loop filter 107.

Figure 2:
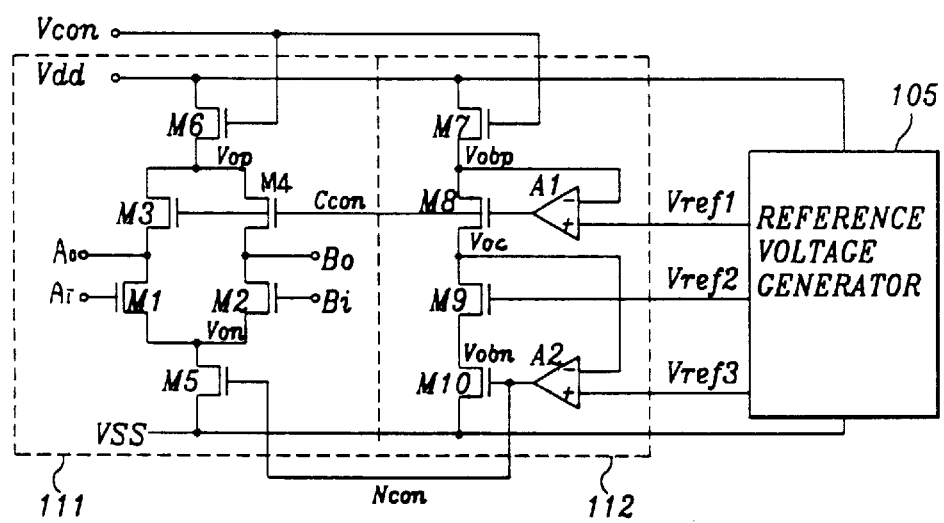
FIG. 2 is a circuit diagram illustrating a voltage controlled oscillator in the circuit of FIG. 1.

The voltage controlled oscillator 103, as shown in FIG. 2, includes a differential delay cell 111 and a cell bias circuit 112.

Three differential delay cells 111 are preferably connected one after another in series. In each of the differential delay cells 111, a control signal Vcon is applied to the gate of a PMOS transistor M6 having its source connected to a voltage Vdd. A control signal Ccon is applied to the gates of PMOS transistors M3 and M4 having their sources commonly connected to the drain of the PMOS transistor M6. A control signal Ncon is applied to the gate of an NMOS transistor M5 having its source connected to a voltage Vss. Input signals Ai and Bi are applied to the gates of NMOS transistors M1 and M2 having their sources commonly connected with the drain of the NMOS transistor M5. The drains of transistors M1 and M3 are commonly connected to one another as are the drains of transistors M2 and M4, and signals A0 and B0 are outputted at the respective connection points formed therebetween.

In the cell bias circuit 112, PMOS transistors M7 and M8 and NMOS transistors M9 and M10 having their gates connected to receive voltages Vcon, Ccon, Vref and Ncon, respectively, are connected in series between the voltages Vdd and Vss. The reference voltage Vref1 is supplied to a non-inverting input terminal of an amplifier A1 of which its inverting input terminal is supplied with the drain voltage Vobp from the PMOS transistor M7. The control signal Ccon is outputted from the amplifier A1, and this output is applied to the gate of the PMOS transistor M8. A reference voltage Vref3 is applied to the inverting input terminal of an amplifier A2 of which its non-inverting input terminal is supplied with the drain voltage Voc from the PMOS transistor M8, and the output signal Ncon of the amplifier A2 is applied to the gate of the NMOS transistor M10.

The frequency divider 104 includes a prescaler 108 for frequency-dividing the signal f0 by 7 or 8, and a frequency divider 109 for frequency-dividing the output of the prescaler 108 by 32 and for outputting the signal of frequency f0/N to the phase detector 101.

Figure 3:
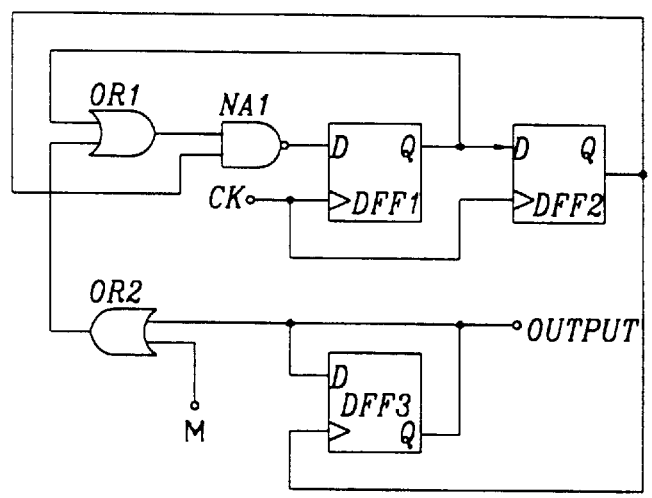
FIG. 3 is a circuit diagram illustrating a prescaler in the circuit of FIG. 1.

As shown in FIG. 3, in the prescaler 108, a clock signal CK is applied to the signal lock terminal of D type flip-flop DFF1 and DFF2. The output signal Q of the flip-flop DFF1 is applied to one input terminal of an OR-gate OR of which its other input is applied with the output signal of an OR-gate OR2 which receives a control signal M and an output signal f0 as inputs. The output signal Q of the flip-flop DFF2 is applied to one input terminal of a NAND-gate NA1 of which its other input is applied with the output signal of the OR-gate OR1. The output signal of the NAND-gate NA1 is applied to the D input terminal of the flip-flop DFF1. A D type flip-flop DFF3 is connected for outputting the signal V0 at its /Q output feeds the output signal V0 to the D input terminal thereof in accordance with the Q output signal of the flip-flop DFF2 which is applied to its clock input.

Figure 4:
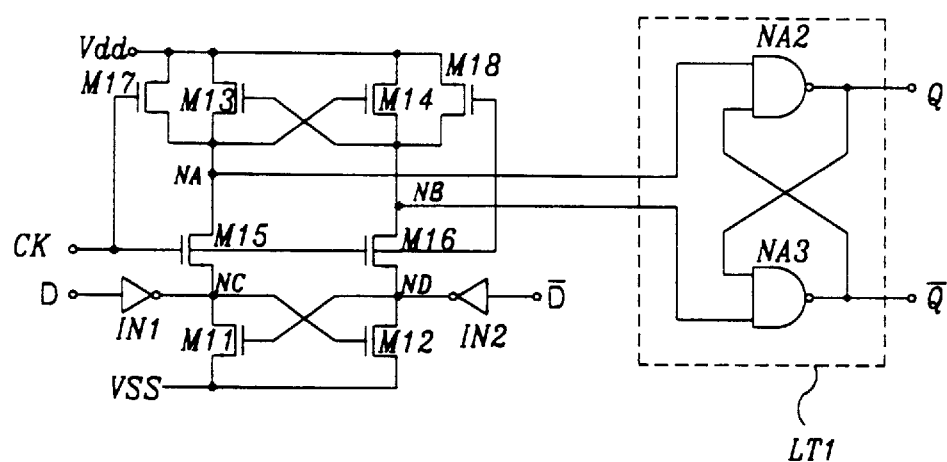
FIG. 4 is a circuit diagram illustrating a D type flip-flop in the circuit of FIG. 3.

As shown in FIG. 4, in each of the flip-flops DFF1 through DFF3, the sources of PMOS transistors M17, M13, and M14 and M18 are connected to be supplied with the voltage Vdd, and the drains of transistors M17 and M13 ad of transistors M14 and M18 are respectively connected, and the connection drain common point between the transistors M17 and M13 is connected to the gate of the transistor M14, the drain of an NMOS transistor 15 and to the input "N" of a latch LT1. The common drain connection point between the transistors M14 and M18 is connected to the gate of the transistor M13, the drain of an NMOS transistor M16 to which the clock signal CK is applied, and to an input "N" of the latch LT1, respectively. The output of an inverter 11 to which the "D" input is applied is connected to the source of the NMOS transistor M15, the drain of an NMOS transistor M11 having its source connected to ground, and to the gate of an NMOS transistor M12 having its source connected to ground, respectively. The output of an inverter 12 to which "D" input is applied is connected to the source of the NMOS transistor M16, the source of the transistor M12, and to the gate of the transistor M11, respectively. The latch LT1 outputs signals Q and /Q.

The latch LT1 includes two NAND-gates NA2 and NA3 at which one of their inputs respectively receive the respective output signals Q and /Q therefrom.

Figure 5:
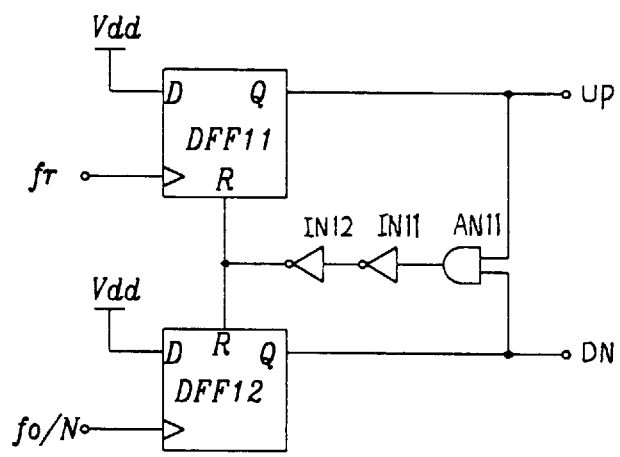
FIG. 5 is a circuit diagram illustrating a phase frequency detector in the circuit of FIG. 1.

As shown in FIG. 5, the phase detector 101 includes a D type flip-flop DFF11 for outputting an "UP" signal at its Q output by latching the voltage Vdd applied to its D input using the input signal fr applied to its clock input, a D type flip-flop DFF12 or outputting a "DOWN" signal at its Q output by latching the voltage Vdd applied to its clock input, and an AND-gate AN11 for ANDing the UP and DOWN signals, and series inverters IN11 and IN12 for sequentially inverting the output of the AND-gate AN11 and applying the inverted output to the reset terminals of flip-flop DFF11 and DFF12 for resetting the flip-flop DFF11 and DFF12.

Figure 6:
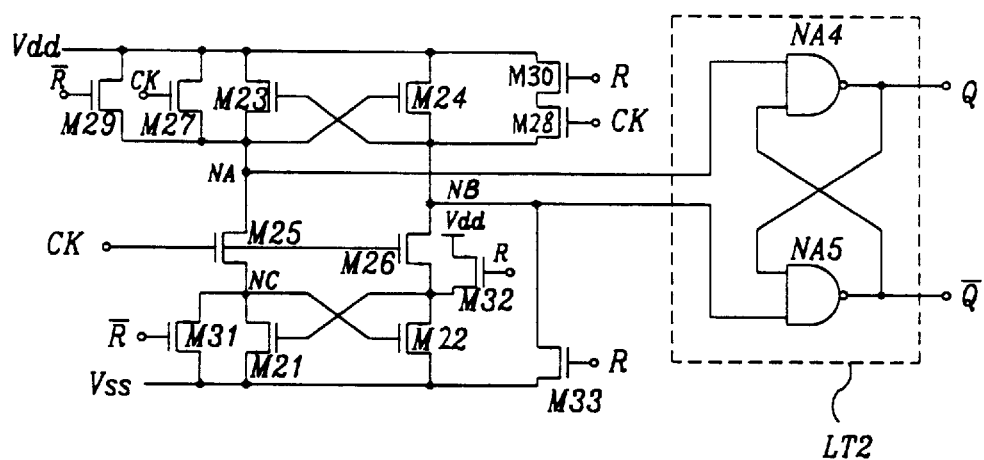
FIG. 6 is a circuit diagram illustrating a D type flip-flop in the circuit of FIG. 5.

As shown in FIG. 6, in each of the flip-flop DFF11 and DFF12, the voltage Vdd is applied to the source of PMOS transistors M29, M27, M23, M24, and M30, and the drains of the PMOS transistors M29, M27, and M23 are commonly connected to the gate of the PMOS transistor M24 and to the input "N" of a latch LT2, and to the drain of an NMOS transistor M25 having its gate connected to the clock signal CK. In addition, the drain of a PMOS transistor M28 having its source connected to the drain of the transistor M30 is connected to the drain of the transistor M24, to the gate of the transistor M23, to an input "N" of the latch LT2, to the drain of an NMOS transistor M26 having its gate connected to receive the clock signal CK, and to the drain of an NMOS transistor M33 having its gate connected to receive the reset signal "R". The source of the transistor M33 and th sources of NMOS transistors M31 and M21 are commonly connected to a voltage Vss. The source of the transistor M25 is connected to the commonly connected drains of the transistors M31 and M21 and the gate of the transistor M22, and the source of the transistor M26 is connected to the gate of the transistor M21, to the drain o the transistor M22, and to the drain of a PMOS transistor M22 having its source connected to the voltage Vdd. The gates of the transistors M30, M32, and M33 are applied with reset signal "R", and the gates of the transistors M27, M28, M25, and M26 are applied with the clock signal CK, and the gates of the transistors M29 and M31 are applied with an inverted reset signal /R.

The latch LT2 includes two NAND gates N14 and N15 which respectively outputs and which at their inputs Na, Nb, respectively receive the signals.

The operation and effects of the present invention will now be explained.

The phase of input signal frequency fr and the frequency-divided output signal of frequency f0/N from the voltage control oscillator 103 are compared by the phase detector 101, and the errors UP and DN with respect to the phase difference therebetween are detected.

Here, in the charge pump and loop filter circuit 102, the outputs UP and DN from the phase detector 101 are differentially amplified by the charge pump 106, and the loop filter 107 outputs the low frequency voltage Vcon corresponding to the detected phase error from the phase detector 101 to the voltage control oscillator 103.

The voltage control oscillator 103 generates a signal frequency f0 corresponding to the output voltage from the loop filter 107.

The frequency divider 108 divides the input frequency f0 from the voltage control oscillator 103 into one-seventh or one-eighth thereof, and the frequency divider 109 divides the 1/7- or 1/8-divided frequency by 1/32, and inputs the signal frequency f0/N to the phase detector 101.

Therefore, as the phase detector 101 repeats the operation of comparing the input signal of frequency fr with the output signal of frequency f0/N from the frequency divider 104 and detecting the phase error, the phases of the input signal of frequency fr and the frequency divided signal of frequency f0/N become identical. As a result, the output frequency f0 becomes N*fr or N-times the input signal frequency Fr.

A desired frequency f0 is generated by adjusting the frequency dividing multiple of the prescaler 108 and thereby the divisor value "N".

The prescaler 108 is operated as a high frequency, and the frequency divider 109 is a programmable counter and is operated at a lower frequency.

The operation of each block, functional block of the frequency synthesizer according to the present invention will now be explained.

Since the general CMOS ring oscillator is susceptible to power supply noise, which degrades the performance of the frequency synthesizer, the voltage controlled oscillator 103 is formed with a differential delay cell, thus removing the power supply noise.

Namely, the voltage controlled oscillator 103, as shown in FIG. 2, is formed with a differential delay cell 111 and the cell bias circuit 112, thus removing the power supply noise as well as a substrate noise.

In addition, the interface noise of the transistors is removed during the operation of the phase locked loop (PLL), and the thermal noise of the transistors is optimized by adjusting the bias current and the capacitance of the input device of the differential delay cell 111.

First, in the voltage controlled oscillator 103 adapted with the differential delay cell, the control signal Vcon inputted from the charge pump and loop filter circuit 102 is applied to the gate of the PMOS transistor M6, and then the delay cell current is controlled, and NMOS transistors M1 and M2 having their sources connected to the NMOS transistor M5 constitute differential inverters, thus generating output signals A0 and B0 in accordance with input signals Ai and Bi.

In addition, the PMOS transistors M3 and M4 are operated within a saturated region in accordance with the control signal Ccon inputted from the cell bias circuit 112.

The cell bias circuit 112 operates the differential delay cell 111 in accordance with reference voltages Vref1~Vref3 inputted from the reference voltage generator 105 and the control signal Vcon inputted from the filter 102.

Here, the PMOS transistor M8 has the same size as the PMOS transistors M3 and M4, and the NMOS transistor M10 has the same size as the current supply transistor M5 of the differential delay cell 111.

In addition, the PMOS transistor M7 has the same size as the NMOS transistor M1 of the differential delay cell 111.

The transistors M8 and M9 and amplifiers A1 and A2 serve to adjust the gate voltages of the transistors M3 and M4 of the differential delay cell 111 and the gate voltage of the transistor M5.

In the voltage controlled oscillator 103, when the control signal Vcon is inputted from the charge pump and loop filter circuit 102, the turn-on level of the PMOS transistor is varied in accordance with the variation of the input voltage, and the current of the differential delay cell 111 is varied. Namely, it is possible to vary the oscillation frequencies A0 and B0 by varying the delay time of the differential delay cell 111.

Here, if the voltage amplitude is made constant by the cell bias circuit 112 in accordance with an addition of paracapacity to the output terminals A0 and B0 of the differential delay cell 111, the delay time of the differential delay cell 111 is reversely proportional to the current of the delay cell, and the output oscillation frequency is proportional to the current.

Since the NMOS transistors M1 and M2 constitute a differential inverter, the differential delay cell 111 is highly resistant (cancels) to the power supply voltage noise and common mode noise.

If a higher level voltage is supplied to the input terminal Ai, and a lower level voltage is supplied to the input terminal Bi, current flows to the NMOS transistor M1, so that the output terminal A0 becomes a lower level voltage, and the output terminal B0 becomes a higher level voltage.

Here, the NMOS transistor M1 is operated in a linear region, and the operation in the linear region is performed when the voltage Vgs between the gate and the source and the voltage Vds between the drain and the source are determined, and the level of the current is determined.

If the current is fixed, and the gate voltage is fixed, the drain voltage can be adjusted by adjusting the source voltage.

In addition, the higher voltage level is the drain voltage Vop of the PMOS transistor M6, and the lower voltage level is the voltage "Von+Vds" which is higher than the drain voltage Von of the NMOS transistor M5 by as much as the voltage Vds between the drain and the source.

Here, the cell bias circuit 112 serves to maintain the oscillation signals A0 and B0 outputted from the differential delay cell 111 to be constant even with respect to a control input Vcon, a power supply voltage, and a temperature variation.

Namely, the PMOS transistor M7 having the same size as the PMOS transistor M6 of the differential delay cell 111 sequentially outputs the current having the same level as the current of the delay cell to the transistors M8 through M10 in accordance with the control signal Vcon inputted from the filter 102.

In addition, the amplifier A1 is connected to a feedback circuit and adjusts the gate voltage Ccon of the transistor M8 in order for the drain voltage of the transistor M7 to be the same as the reference voltage Vref1 outputted from the reference voltage generator 105, and the gate voltage Ccon of the transistor M8 is connected to the gates of the PMOS transistors M3 and M4 of the differential delay cell 111 in order for the level of the voltage Vop to be identical with the reference voltage Vref1.

In addition, the reference voltage Vref2 is supplied to the gate of the transistor M9 having the same size as the transistors M1 and M2. Here, the level of the reference voltage Vref2 is the same as the reference voltage Vref1.

The source voltage of the NMOS transistor M9 is adjusted by adjusting the output Ncon of the amplifier A2 which is inputted to the gate of the NMOS transistor M10 in order for the lower voltage emit of the oscillation signal to be the same level as the reference voltage Vref3.

In the voltage amplitude of the oscillation signal, the reference voltage Vref1 becomes the higher level voltage limit, and the reference voltage Vref3 becomes the lower voltage level limit.

The reference voltages Vref1 through Vref3 are generated by the reference voltage generator 105 and have a constant voltage value irrespective of the power supply voltage and the temperature variation, so that the amplitude of the oscillation signal is constant.

The voltage controlled oscillators (VCO) 103 has a strong resistance to the power supply voltage noise due to using the differential inverter. Since the oscillation frequency is determined only by the current of the differential delay cell 111, the frequency control region is not limited due to bias problems, thus obtaining a wider frequency control region.

In addition, when the power supply voltage is 5V, it is possible to make the voltage amplitude of the oscillation signal be higher than 3V and to make the same be symmetrical about the intermediate point of the power supply voltage. Therefore, connection between the amplifier or the level converter is unnecessary, thus driving the CMOS circuit directly.

The frequency divider 104, which is directed to dividing the frequency f0 by a predetermined divisor "1/n" when the voltage controlled oscillator 103 outputs the oscillation frequency f0, is formed by the prescaler 108 and the frequency divider 109.

Referring to FIG. 3, the prescaler 108 is a dual stage prescaler. D type flip-flops DFF1 and DFF2 which are formed in a two-tier structure serve as ⅓ and ¼ synchronous counters, and the D type flip-flop DFF2 which is formed in an one-tier structure serves as an asynchronous counter.

The D type flip-flop DFF3 which serves as the synchronous counter is formed as a toggle flip-flop and performs a ½ divide operation. In case of increasing the divide ratio, the number of tiers of the toggle flip-flop is increased.

First, when the logic value of the control signal M is 1, the synchronous counter divides the input frequency by 4 through the flip-flops DFF1 and DFF2, and the asynchronous counter performs a divide by 2 operation using the frequency inputted from the synchronous counter as a clock, and the frequency divided by 8 is outputted to the frequency divider 109.

In addition, when the logic value of the control signal M is 0, the divide ratio of the synchronous counter is made different in accordance with the logic value of the output terminal of the asynchronous counter.

Namely, while the logic value of the asynchronous counter output is 1, the input frequency is divided by 4 as in the state when the input value of the control signal M is 1. In addition, when the output value of the asynchronous counter is 0, the divide ratio of the synchronous counter is ⅓.

Therefore, when the input value of "M" is 0, the divide ratio is 1/7.

The construction of the flip-flops DFF1 through DFF3 is shown in FIG. 4. With such a construction, it is possible to reduce an error occurrence rate through the differential operation, and it is possible to improve the characteristic with respect to the noise by storing information in a static node.

The above-mentioned processes will now be explained.

First, when the clock signal CK is inputted as 0, the transistors M15 and M16 are turned off, and the nodes Nc and Nd and the nodes Na and Nb are isolated, and the precharge transistors M7 and M8 are turned on, and the nodes Na and Nb are precharged with the logic value "1".

The signals of the nodes NA and NB are applied to the latch LT1 formed by the NAND-gates NA2 and NA3, and the latch LT1 maintains the previous input state as an output value.

In addition, in the state that the clock signal CK is 0, when the level of the input signals D and D' are changed, the level state of the nodes Nc and Nd are changed in accordance therewith.

For example, if the input value D is 1, and the input value /D is 0, the level of the node Nc is made 0 by the inverters IN1 and IN2, and the level of the node Nd is made 1 thereby.

When the clock signal CK value is 1, the precharge transistors M17 and M18 are turned off, and the transistors M15 and M16 are turned on, and the transistors M11 and M12 are connected to the transistors M13 and M14, respectively.

The NMOS transistors M1 and M2 and the PMOS transistors M3 and M4 are cross-wise connected to each other so as to form a static latch.

However, if the clock signal CK is 0, the nodes Na and Nb are precharged with "1", and since the nodes Nc and Nd have levels of 0 and 1, respectively, in accordance with the input signals D and /D, when the clock signal CK is 1, the transistor M16 is turned off as when clock signal CK is 0, and the transistor M15 is turned on, and the voltage of the node Na is lowered down to 0.

The non-inverted output Q of the latch LT1 form by the NAND-gates NA2 and NA3 is 1, and the inverted output /Q is 0.

Thereafter, when the clock signal CK becomes 0 again, the previous output state is maintained, and this output state is not changed if the input signal value is changed.

In the D flip-flops DFF1 through DFF3 which perform the above-mentioned processes, because the nodes Na and Nb are precharged at the time when the clock signal CK is 0, the operation speed is fast, and it has a characteristic which is strongly resistant to common mode noise due to the differential signal process. In addition, because of the static circuit of which all nodes of the circuit are connected to the power supply voltage or to ground in the system, the system has some advantages with respect to the power supply voltage noise.

Therefore, in the frequency divider 104, when the output frequency f0 of the voltage control oscillator 103 is inputted, and the prescaler 108 divides the output frequency f0 by 7 or 8, the frequency divider 109 which has a toggle flip-flop constructed in a five-tier structure divides the output frequency f0 by 32 again and outputs the divided frequency f0/N to the phase detector 101.

The phase detector(PFD) 101 is formed as a differential signal system in order to reduce noise, and is formed with a delayed reset scheme in order to input the up/down signals UP and DN to the filter 102 at every cycle.

First, with reference to FIG. 5, the phase detector 101 outputs an up signal UP as the D flip-flop DFF1 1 latches the voltage Vdd using the input reference signal frequency fr as a clock, and outputs a down signal DN as the flip-flop DFF12 latches the voltage Vdd using the output frequency fo/N from the frequency divider 104 as a clock.

Here, when the AND-gate AN11 ANDS the up and down signals UP and DN, the thusly ANDed signal is applied to the flip-flops DFF11 and DFF12 through the inverters IN11 and IN12 as a reset signal.

Namely, as shown in FIG. 6, in the flip-flops DFF11 and DFF12, the NMOS transistors M25 and M26 are turned off when the clock signal CK is 0, and the PMOS transistors M27 and M28 are turned on.

When the reset signal R is 1, the level of the node Na is 1, and the level of the node Nb is 0. The latch LT2 formed by the NAND-gates NA4 and NA5 outputs the non-inverted output signal Q and at the same time the inverted output signal /Q.

Thereafter, since the non-inverted output signal Q of the latch LT12 is 0, when the reset signal R is 0, the PMOS transistor M30 is turned on, and the NMOS transistor M33 is turned off, and the node Nb is precharged, and the PMOS transistor M32 is turned on, and the NMOS transistor M21 is turned on, and the NMOS transistor M22 is turned off.

When the clock signal CK is 1, the NMOS transistors M25 and M26 are turned on, and the level of the node Na is 0.

Therefore, the level of the node Na is 0, and the level of the node Nb is 1, and the non-inverted output signal Q of the latch LT2 is 1, and the inverted output signal /Q thereof is 0.

Namely, the flip-flops DFF11 and DFF12 perform an asynchronous reset function using their differential structures.

The outputs UP and DN from the phase detector 101 are inputted to the charge pump and loop filter circuit 102 formed by the charge pump 106 and the loop filter 107 as shown in FIG. 7.

The voltage controlled oscillator 103 outputs the oscillation frequency f0 by receiving the output voltage from the charge pump and loop filter circuit 102 as an input.

The frequency synthesizer apparatus according to the present invention is directed to implementation using one chip, except for the filter, by using a 0.8 $\mu$m CMOS integration technique, and the reference voltage generator 105 is externally connected for noise decoupling with respect to the reference voltage node using a capacitor since there are many noise sources inside the chip.

In addition, in the chip layout, the Vdd voltage bus is divided into multiple buses so as to prevent noise coupling between circuits arranged within the chip, with the multiple buses being connected to each other outside the chip. Namely, the Vdd voltage bus is divided into an analog section, a digital section, and a VCO section.

Here, if the phase noise of the prescaler 108 and the frequency divider 109 is made negligible, the frequency division ratio is 7*32 =224, so the frequency inputted to the frequency divider 109 is multiplied by the above frequency division ratio, for thus computing the output frequency f0 of the voltage control oscillator 103.

For example, if the effective range of the reference frequency fr is from 1.1 Mhz to 2.2 Mhz, the output frequency f0 of the voltage controlled oscillator 103 ranges from 246.4 Mhz to 492.8 Mhz.

Figure 8:
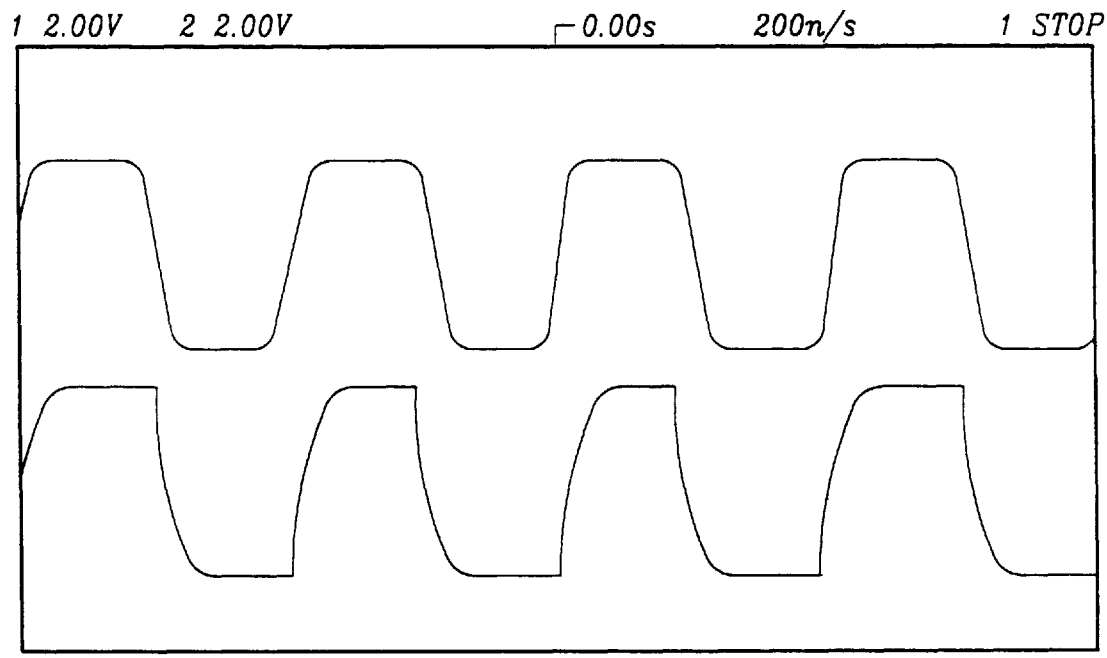
FIG. 8 is a waveform illustrating a frequency fixed characteristic based on a reference input according to the present invention.

FIG. 8 is a waveform diagram showing a locking characteristic when the reference input frequency fr is 2 Mhz, in which the upper wave form is an input wave form from the reference signal generator, and the lower wave form is the wave form of the locked signal.

Figure 9:
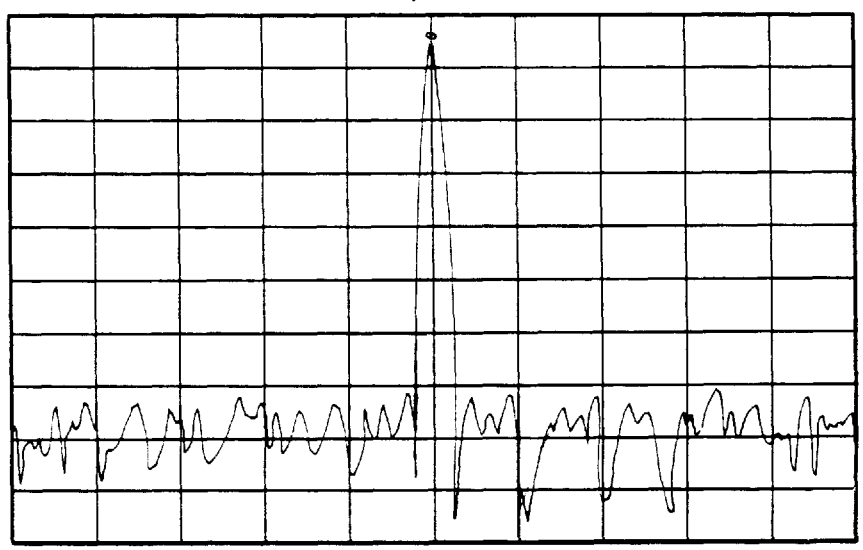
FIG. 9 is a waveform illustrating a spectrum characteristic based on a reference input according to the present invention.

FIG. 9 is a frequency spectrum diagram which was obtained by measuring the output signal of the frequency divider when the reference input frequency fr was 2.2 Mhz using a spectrum analyzer.

As described above, the frequency synthesizer of the present invention is directed to reducing noise by adopting the differential method with respect to each circuit of the system, and thus it is adaptable to the mobile communication system.

In particular, in the case of the voltage controlled oscillator, the performance of the frequency synthesizer apparatus is enhanced by generating a constant frequency in accordance with the voltage level which is determined by the reference voltage. In addition, the frequency synthesizer of the present invention is directed to using the differential delay cell.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. An apparatus for synthesizing frequencies comprising:
   a phase detector for comparing an input signal with a reference frequency signal and for detecting a phase difference therebetween;

a charge pump and a loop filter for differentially amplifying an output of the phase detector for generating a control voltage corresponding to the phase difference;

a voltage controlled oscillator for generating a frequency signal corresponding to an output voltage of the charge pump and the loop filter;

frequency divider for dividing the frequency signal generated by the voltage controlled oscillator by a predetermined number and for outputting a frequency-divided signal to the phase detector, wherein the frequency divider includes a prescaler adapted to divide the frequency signal by an odd number; and a reference voltage generator for inputting first, second and third reference voltages to the voltage controlled oscillator for controlling the frequency signal.

2. The apparatus of claim 1, wherein the phase detector includes:

a first flip-flop for outputting an up signal by latching a supply voltage and applying the input signal to a clock terminal of the first flop;

a second flip-flop for outputting a down signal by latching the supply voltage and applying the frequency-divided signal to a clock terminal of the second flip flop;

an AND-gate for ANDing the up and down signals; and series inverters for sequentially inverting an output of the AND-gate and for generating a reset signal and an inverted reset signal for resetting the first and second flip-flops.

3. The apparatus of claim 2, wherein each of the first and second flip flops includes:

first, second, third, fourth, fifth, sixth and seventh PMOS transistors;

first, second, third, fourth, fifth and sixth NMOS transistors; and a latch having first and second inputs;

wherein sources of the first, second, third, fourth, fifth and seventh PMOS transistors are connected to the supply voltage, wherein drains of the first, second and third PMOS transistors are connected to the first input of the latch and to a gate of the fourth PMOS transistor, wherein drains of the fourth and sixth PMOS transistors are connected to a gate of the third PMOS transistor and to the second input of the latch, wherein a source of the sixth PMOS transistor is connected to a drain of the fifth PMOS transistor, wherein gates of the second and fifth PMOS transistors and gates of the first and second NMOS transistors are connected to a clock, wherein gates of the fifth PMOS transistor and the sixth NMOS transistor are connected to the reset signal, wherein gates of the first PMOS transistor and the third NMOS transistor are connected to the inverted reset signal, wherein sources of the third, fourth, fifth and sixth NMOS transistors are connected to a ground voltage, wherein a drain of the fifth NMOS transistor is connected to a drain of the seventh PMOS transistor, to a source of the second NMOS transistor and to a gate of the fourth NMOS transistor, wherein drains of the sixth and second NMOS transistors are connected to the second input of the latch, and wherein drains of the third and fourth NMOS transistors are connected to a source of the first NMOS transistor and to a gate of the fifth NMOS transistor.

4. The apparatus of claim 1, wherein the frequency divider includes a divider for dividing an output frequency of the prescaler by a power of two and for outputting the frequency-divided signal to the phase detector as an input signal.

5. The apparatus of claim 4, wherein the prescaler includes:

first, second and third flip flops having first, second and third D outputs, respectively;

first and second OR gates; and a NAND gate, wherein a clock is applied to clock terminals of the first and second flip flops, wherein the second D output is applied to a clock terminal of the third flip flop, wherein a mode control signal and the third D outputs are applied to input terminals of the second OR gate, wherein an output of the second OR gate and the first D output are applied to input terminals of the first OR gate, and wherein an output of the first OR gate and the second D output are applied to input terminals of the NAND gate.

6. The apparatus of claim 5, wherein the first and second flip-flops are each operated as a synchronous counter.

7. The apparatus of claim 5, wherein the third flip-flop is operated as an asynchronous counter.

8. The apparatus of claim 5, wherein each of the first, second and third flip flops includes:

first, second, third and fourth PMOS transistors;

first, second, third and fourth NMOS transistors;

first and second inverters;

a D input and an inverted D input; and a latch having first and second inputs, wherein sources of the first, second, third and fourth PMOS transistors are connected to a supply voltage, wherein sources of the second and third NMOS transistors are connected to a ground voltage, wherein drains of the first and second PMOS transistors are connected to the first input of the latch, to a gate of the third PMOS transistor and to a drain of the first NMOS transistor, wherein drains of the third and fourth PMOS transistors are connected to the second input of the latch, to a gate of the second PMOS transistor and to a drain of the fourth NMOS transistor, wherein a source of the first NMOS transistor is connected to a drain of the second NMOS transistor, to a gate of the third NMOS transistor and to an output of the first inverter, wherein a source of the fourth NMOS transistor is connected to a drain of the third NMOS transistor, to an output of the second inverter and to a gate of the second NMOS transistor, wherein the clock is connected to gates of the first and fourth PMOS transistors and to gates of the first and fourth NMOS transistors, wherein the D input is connected to an input of the first inverter, and wherein the inverted D input is connected to an input of the second inverter.

9. The apparatus of claim 1, wherein the voltage controlled oscillator includes:

an odd number of delay cells coupled in series for outputting the frequency signal according to the output of the charge pump and the loop filter and according to control signals; and a cell bias circuit for outputting a delay control signal to the delay cells using the first, second and third reference voltages as inputs.

10. The apparatus of claim 9, wherein the cell bias circuit includes:

first and second PMOS transistors;

first and second NMOS transistors; and first and second amplifiers for outputting the control signals and each having inverting and non-inverting inputs, wherein a source of the first PMOS transistor is connected to a supply voltage, wherein a gate of the first PMOS transistor is connected to a control voltage, wherein a drain of the first PMOS transistor is connected to the inverting input of the first amplifier and a source of the second PMOS transistor, wherein a gate of the second PMOS transistor is connected to a first control signal, wherein a drain of the second PMOS transistor is connected to the inverting input of the second amplifier and to a drain of the first NMOS transistor, wherein a gate of the first NMOS transistor is connected to the second reference voltage, wherein a source of the first NMOS transistor is connected to a drain of the second NMOS transistor, wherein a gate of the second NMOS transistor is connected to a second control signal, wherein a source of the second NMOS transistor is connected to a ground voltage, wherein the non-inverting input of the first amplifier is connected to the first reference voltage, and wherein the non-inverting input of the second amplifier is connected to the third reference voltage.

11. The apparatus of claim 9, wherein the delay cell includes:

first, second and third PMOS transistors; and first, second and third NMOS transistors, wherein a source of the first PMOS transistor is connected to a supply voltage, wherein a gate of the first PMOS transistor is connected to a control voltage, wherein a drain of the first PMOS transistor is connected to sources of the second and third PMOS transistors, wherein gates of the second and third PMOS transistors are connected to a first control signal, wherein drains of the second and third PMOS transistors are connected to drains of the second and third NMOS transistors, respectively, wherein gates of the second and third NMOS transistors are connected to the output of the charge pump and the loop filter, wherein sources of the second and third NMOS transistors are connected to a drain of the first NMOS transistor, wherein a gate of the first NMOS transistor is connected to a second control signal, and wherein a source of the first NMOS transistor is connected to a ground voltage.

12. A frequency synthesizer comprising:

a phase detector for comparing an input signal with a reference frequency signal and for detecting a phase difference therebetween;

a charge pump and a loop filter for differentially amplifying an output of the phase detector for generating a control voltage corresponding to the phase difference;

a voltage controlled oscillator for generating a frequency signal corresponding to an output voltage of the charge pump and the loop filter;

a frequency divider for dividing the frequency signal generated by the voltage controlled oscillator by a predetermined number and for outputting a frequency-divided signal to the phase detector, wherein the frequency divider includes a prescaler adapted to divide the frequency signal by an odd number; and a reference voltage generator for inputting first, second and third reference voltages to the voltage controlled oscillator for controlling the frequency signal, wherein the voltage controlled oscillator includes:

first, second and third voltage controlled delay cells coupled in series; and a bias circuit for controlling each voltage controlled delay cell by using the reference voltages, wherein outputs of the first voltage controlled delay cell are inputs of the second voltage controlled delay cell, wherein outputs of the second voltage controlled delay cell are inputs of the third voltage controlled delay cell, and wherein outputs of the third voltage controlled delay cell are inputs of the first voltage controlled delay cell.

13. The frequency synthesizer of claim 12, wherein each of the voltage controlled delay cells in the voltage controlled oscillator includes:

first, second and third PMOS transistors; and first, second and third NMOS transistors, wherein a source of the first PMOS transistor is connected to a supply voltage, wherein a gate of the first PMOS transistor is connected to sources of the second and third PMOS transistors, wherein gates of the second and third PMOS transistors are connected to a first control signal, wherein drains of the second and third PMOS transistors are connected to drains of the second and third NMOS transistors, wherein gates of the second and third NMOS transistors are connected to an input voltage, wherein sources of the second and third NMOS transistors are connected to a drain of the first NMOS transistor, wherein a gate of the first NMOS transistor is connected to a second control signal, and wherein a source of the first NMOS transistor is connected to a ground voltage.

* * * * *